United States Patent
Fukatani et al.

(10) Patent No.: US 6,853,056 B2
(45) Date of Patent: Feb. 8, 2005

(54) SEMICONDUCTOR DEVICE HAVING A BASE METAL LEAD FRAME

(75) Inventors: Tadao Fukatani, Fukuoka (JP); Hiroshi Masuda, Fukuoka (JP); Koji Motonami, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/194,296

(22) Filed: Jul. 15, 2002

(65) Prior Publication Data

US 2003/0116837 A1 Jun. 26, 2003

(30) Foreign Application Priority Data

Dec. 25, 2001 (JP) .................................. 2001-392695

(51) Int. Cl.⁷ .................... H01L 23/495; H01L 23/48
(52) U.S. Cl. .................... 257/666; 257/676; 257/693; 257/784
(58) Field of Search .................... 257/666, 672, 257/676, 677, 690, 692, 693, 780, 784; 438/123, 614, 617

(56) References Cited

U.S. PATENT DOCUMENTS

| | | | |
|---|---|---|---|
| 5,818,105 A | * | 10/1998 | Kouda .................... 257/696 |
| 6,518,652 B2 | * | 2/2003 | Takata et al. .................... 257/676 |
| 2003/0116842 A1 | * | 6/2003 | Motonami et al. .................... 257/692 |

FOREIGN PATENT DOCUMENTS

| | | |
|---|---|---|
| JP | 60-211953 | 10/1985 |
| JP | 61-208246 | 9/1986 |
| JP | 5-102374 | 4/1993 |
| JP | 5-347320 | 12/1993 |
| JP | 9-74159 | 3/1997 |
| JP | 2001-237262 | 8/2001 |

OTHER PUBLICATIONS

Huneke, "Die Attach Adhesion on Leadframes Treated with Antioxidants", IEEE/CPMT Electronic Packaging Technology Conference, 1997, pp. 208–214.*

* cited by examiner

Primary Examiner—Eddie Lee
Assistant Examiner—Hung Vu
(74) Attorney, Agent, or Firm—Finnegan, Henderson, Farabow, Garrett & Dunner, L.L.P.

(57) ABSTRACT

Disclosed is a semiconductor device which has a semiconductor chip; a base metal lead frame with no residual of a rustproof film, including a die pad mounted with said semiconductor chip, and a plurality of leads disposed so that inner ends of said leads are positioned along the periphery of said die pad, copper wires to directly connect electrodes on said semiconductor chip to the inner ends of said plurality of leads; and a resin molded member to hermetically seal said semiconductor chip, a large proportion of said lead frame and said copper wires; wherein an initial detachment area of said resin molded member at the bottom side of the die pad is 20% or less to the whole die pad area.

5 Claims, 4 Drawing Sheets

| | OUTER LEAD SOLDER PLATING | |
|---|---|---|
| | ELECTROLYTIC DEGREASING TIME | PREPROCESSING TIME (SULFURIC ACID SERIES) |
| PRIOR ART (USING BTA SERIES RUSTPROOF AGENT) | 80 SEC | 20 SEC |
| INVENTION (USING NON-BTA SERIES RUSTPROOF AGENT) | 72 SEC | 18 SEC |
| IMPROVEMENT | 8 SEC (Δ10%) | 2 SEC (Δ10%) |

SEMICONDUCTOR DEVICE HAVING A BASE METAL LEAD FRAME

CROSS REFERENCE TO RELATED APPLICATIONS

This application is based upon and claims the benefit of priority from the prior Japanese Patent Application No. 2001-392695, filed on Dec. 25, 2001; the entire contents of which are incorporated herein by reference.

BACKGROUND OF THE INVENTION

The present invention relates to a semiconductor device and a method for manufacturing the semiconductor device.

A semiconductor device, particularly, a semiconductor integrated circuit is manufactured generally by use of a lead frame.

FIG. 6 illustrates a typical configuration of the lead frame. This lead frame 100 includes an external frame 101 for ensuring a strength of the whole structure, a die pad (which may be called as an "island") connected to this external frame 101 via connecting members known as tie bars 102 and provided substantially at the center, and a plurality of leads 104 disposed along the periphery of the tie pad 103. Inner ends, facing to the die pad 103, of the plurality of leads 104 are separated from the die pad 103, and connected to the external frame 101 via connecting members referred to as dam bars 105 at the middles of the respective leads. The outer lead segments from the dam bars 105 are exposed from a mold sealed by a resin as will be explained later. These exposed lead segments are called outer leads 104a, while the inner lead segments from the dam bars 105 are sealed by the resin and referred to as inner leads 104b.

Materials used for the lead frame are nickel alloys, Kovar and so on, however, copper or copper alloys composed mainly of copper have been major materials over the recent years.

A semiconductor chip is fixed to the die pad 103 of the thus constructed lead frame 100 by use of a conductive bonding agent such as a silver paste etc. and a solder ribbon etc. Then, electrodes on this semiconductor chip are connected the inner ends of the leads via wires by wire-bonding, and the whole of these portions is sealed by the resin. After cutting off the dam bars 105 remaining outwardly of the resin mold body, the outer leads 104a protruding from the resin mold body undergo forming such as bending and so on. Further, normally solder plating etc is effected in order to enhance a connectivity when connecting the outer leads, thereby obtaining a semiconductor device as a complete product.

This lead frame requires an excellent connectivity to the wire and an excellent connectivity of the outer leads to a printed wiring board etc.

What deteriorates the connection characteristic thereto is an oxide film formed due to oxidation of the lead frame itself. This oxide film appears on the surface of the lead frame due to a heating history in the process of producing and preserving the material and in the process of an assembly of the semiconductor. Copper is preferable in terms of its electric characteristic but has a weak point of its being easy to be oxidized. Therefore, a rustproof film is normally provided on the surface immediately after manufacturing the lead frame by punch-out, etching and so forth in order to prevent the oxide film from being formed thereon. This rustproof film normally involves the use of a benzotriazole (BTA) series.

Further, as described above, the inner leads are connected via the wires to the semiconductor chip. The following is requirements for this wire, wherein the wire is not corroded over a long period of time, exhibits an excellent extendability, and is easy to work and to effect ball-up (ball-shaping) in the atmospheric air. A gold wire as a material meeting these requirements is normally used.

Further, the portions, undergoing the wire-bonding, of the inner leads are normally plated with a noble metal such as silver, palladium and so on in order to enhance a reliability of the connections between these wires and the inner leads.

The film composed of the benzotriazole-series rustproof agent hitherto coated on the lead frame in the process of manufacturing the lead frame for preventing the oxidation, has high heat resisting temperature, and it is therefore required that a complete decomposition be attained by applying the heat at a temperature of 350° C. or higher in the die-bonding process in order to ensure preferable die-bonding and wire-bonding characteristics. The wire-bonding is irresistible against such a higher temperature, and hence the benzotriazole-series rustproof agent can be applied to only the semiconductor devices adopting a high-temperature die-bonding method of applying the heat at the temperature of 350° C. or higher in the die-bonding process, which is, for instance, a solder die-bonding method carried out at an atmospheric temperature in the vicinity of 400° C. Note that this rustproof agent contains a variety of components, some of which are decomposed at the later 200's° C., and therefore the oxide film is partially formed and will be detached in the later processes, with the result that this might adversely affect quality of manufactured devices. Further, the rustproof agent is decomposed by undergoing the heat history in the assembling process to generate a residual substance, and therefore brings about a decline of adhesion of the resin to the lead frame in the resin molding process, resulting in lowering the reliability of the semiconductor device.

On the other hand, a demand for reducing the costs for the semiconductor device is accelerated day by day, however, a proportion of the costs for the noble metals in the semiconductor device as described above is extremely large and becomes an obstacle against reducing the total costs. For example, gold used as the wire material adopted in the wire-bonding process is expensive and largely fluctuates in the market price, and, the majority of the gold wire purchase price being a cost for the (unprocessed) metal, the scheme of reducing the costs is very close to the limit.

An endeavor for discarding other noble metals is underway, however, substitute materials and manufacturing methods not using the previous metals have their own demerits, and there is nothing determinative.

Furthermore, the silver paste used for the die-bonding involves the use of silver as a noble metal of which the price is high and might fluctuate as an undesired factor, and the solder ribbon contains lead. The decision of specifying lead as a harmful substance in terms of the environmental problem is underway, and it is desirable that lead should not be used. None of materials superior to solder in terms of the price, the characteristics and the productivity is not yet discovered at the present, though a replacement with materials such as silver, bismuth (Bi) etc is examined.

Moreover, the outer lead is normally subjected to Sn-Pb solder plating and palladium (Pd) plating. As explained above, the decision that lead contained in the solder plating is specified as the harmful substance is underway, while palladium is the expensive noble metal, and it is desirable that the use of both of lead and palladium be avoided.

SUMMARY OF THE INVENTION

A semiconductor device according to one embodiment of the present invention comprises:

a semiconductor chip;

a base metal lead frame with no residual of a rustproof film, including a die pad mounted with said semiconductor chip, and a plurality of leads disposed so that inner ends of said leads are positioned along the periphery of said die pad;

copper wires to directly connect electrodes on said semiconductor chip to the inner ends of said plurality of leads; and a resin molded member to hermetically seal said semiconductor chip, a large proportion of said lead frame and said copper wires.

A method of manufacturing a semiconductor device according to one embodiment of the present invention comprises:

preparing a base metal lead frame including a die pad and a plurality of leads disposed so that inner ends of said leads are positioned along the periphery of said die pad;

applying a non-benzotriazole series rustproof agent on the surface of said lead frame;

performing die-bonding for fixing a semiconductor chip onto said die pad in a heated atmosphere by use of a non-metal series paste;

performing wire-bonding to connect said electrodes on said semiconductor chip to the inner ends of said leads of said lead frame by use of copper wires;

forming resin molded member by sealing said lead frame with a resin excluding some portions of said leads; and forming leads protruding from said resin molded member.

DETAILED DESCRIPTION OF THE INVENTION

Embodiments of the present invention will now be explained in detail.

Figure 1:
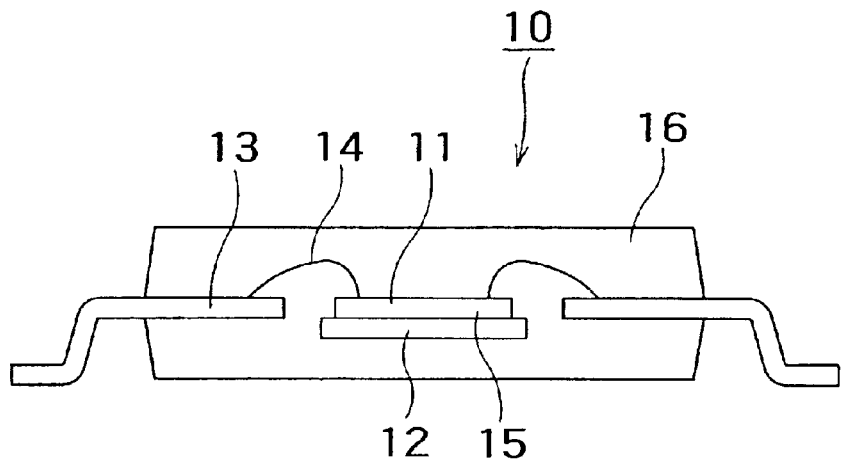
FIG. 1 is a sectional view showing a semiconductor device according to an embodiment of the present invention.

FIG. 1 is a sectional view showing a semiconductor device according to an embodiment of the present invention.

This semiconductor device 10 is configured such that a semiconductor chip 11 is fixed to a tie pad 12 of a lead frame, and inner leads 13 of the lead frame are connected via copper wires 14 to electrodes on the semiconductor chip. The lead frame used herein is composed of copper or copper alloy of which the main component is copper which is base metal.

The following are copper-series materials known as those for the lead frame (unit is weight %)

KFC: Fe;0.1, P; 0.03, and the remaining is Cu

ALLOY 194: Fe; 2.4, Zn; 0.12, P: 0.03, and the remaining is Cu

KLF-1: Ni; 3.2, Si; 0.7, Zn; 0.3, and the remaining is Cu

KLF-125: Ni; 3.2, Si; 0.7, Zn; 0.3, and the remaining is Cu

Further, the inner leads 14 to which the copper wires are connected is plated with none of the noble metal plating as in the prior arts. Further, the die-bonding for securing the semiconductor chip 11 onto the die pad 12 involves the use of a paste e.g., a copper paste 15, preferably not containing the noble metals.

The whole of these elements excluding a part of the leads is sealed by a resin 16, and outer leads 17 protruding from the resin mold undergo forming such as bending etc.

In the thus configured semiconductor device, the use of the noble metal is restrained to the minimum, thereby attaining a reduction in costs.

Next, a method of manufacturing the semiconductor device described above will be discussed in detail.

Figure 2:
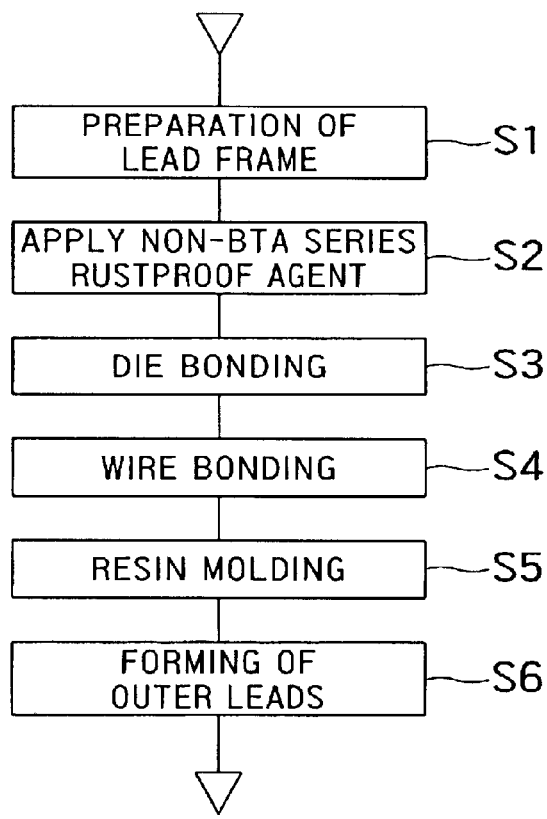
FIG. 2 is a flowchart showing processes of a semiconductor device manufacturing method according to the present invention.

FIG. 2 is a flowchart showing the semiconductor device manufacturing method according to the present invention.

To start with, the lead frame is prepared (step S1). The lead frame is obtained by punching out or etching a copper plate or a copper alloy plate. Just when finishing this operation, the lead frame is immediately coated with a rustproof agent, thereby providing a rustproof film (step S2). This rustproof film is completely decomposed by heating in the vicinity of 250° C. with no generation of residual substance, and what is optimal is a non-BTA series/fatty acid ester series or amine series rustproof agent. When using this rustproof agent, the rustproof film is completely decomposed by the heat history in the later process, which does not exert any adverse influence.

Next, the semiconductor chip is die-bonded to the die pad of the lead frame (step S3). The use of the lead frame having undergone the process described above enables the low-temperature paste die-bonding method to be applied under a reduction heat atmospheric air of 100° C. through 130° C., preferably 100° C. At this temperature, the non-BTA series rustproof agent is not decomposed and remains as it is.

The paste for the die-bonding is preferably, a paste containing, e.g., copper as a base metal, which contains no noble metal and exhibits a high coefficient of thermal conductivity. This paste does not use the noble metal and is therefore capable of decreasing the manufacturing cost and eliminating the harmful substance such as lead.

Subsequently, the wire-bonding is performed (step S4). This wire-bonding, after the inner leads have been connected to the semiconductor chip by use of copper wires, is effected under the atmospheric air of approximately 285° C. At this temperature, the rustproof film is decomposed, and hence the base of copper is exposed, whereby the wire-bonding with a high reliability can be attained.

Namely, the rustproof film on the lead frame is not decomposed in a low-temperature die-bonding process but is completely decomposed by the heat of a bonding head as well as under the heating atmospheric air when the wire-bonding is carried out, and consequently the lead frame is prevented from being oxidized by the time just before the bonding. Thus, good connection of wires can be obtained.

Copper, which is a base metal and is not expensive unlike the noble metals such as gold etc and is small of fluctuations in the market price, which therefore contributes to reduce the manufacturing costs. Further, copper is smaller in specific resistance and more preferable in electric characteristic than gold, and besides has a high Young's modulus. Therefore, copper has characteristics of being small in wire deformation when molded by the resin, high in diffusion speed and therefore advantageous with respect to a temperature cycle. The copper wire is superior to the gold wire in terms of the performance and the reliability as well.

The copper wire has, however, a disadvantage in which hardness of the copper wire is high enough to, it might be an apprehension, cause a damage to the bonding pad when in the wire-bonding process and to decrease a life-span of the bonding head. Namely, ball hardness, i.e., micro Vickers hardness Hv of the generally gold wire is on the order of 51, while the micro Vickers hardness Hv of the general copper wire is as high as about 85.

A scheme against this problem is an addition of phosphorus (P) at a percentage of content on the order of 50 ppm as an added element material to high-purity copper as a material. Incidentally, it is not necessarily preferable that a P-concentration be high, and the hardness in the case of 50 ppm is smaller than in the case of 300 ppm.

The ball hardness of copper can be thereby restrained down to about 57 (Hv). Accordingly, it is conceived that degrees of how much the bonding pad is damaged and the tool is affected, are the same as those of the gold wire.

Subsequently, the whole is sealed with the resin by a transfer mold method or the like (step S5). Since the rustproof film on the lead frame has already been decomposed away at that time, the adhesion of the resin to the lead frame appears very well, and the sealing can be attained with a high reliability.

A method of judging a preferability of this sealing may involve the use of a scanning acoustic tomograph (SAT) (ultrasonic flaw inspection). A scanning acoustic tomography is defined as a non-destructive testing method for observing a state of an interface between heterogeneous substances on the basis of ultrasonic reflecting waveforms. To be specific, this method utilizes such a point that if the adhesion between the mold resin and the leads is poor, an air layer occurs between the mold resin and the leads and reflects 100% the ultrasonic waves, and therefore an image formed by the reflecting waveforms is displayed differently from an image of the good adhesion portion.

Figure 3A:
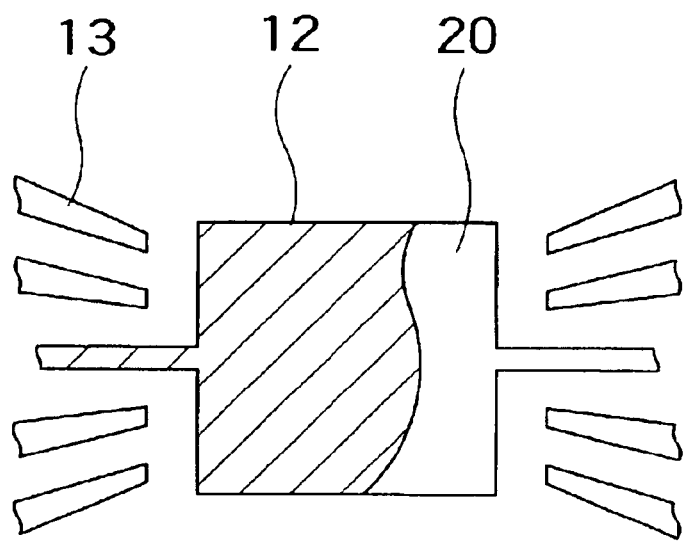
FIGS. 3A and 3B are explanatory diagrams showing how an detached area detected by use of a scanning acoustic tomograph is indicated.
Figure 3B:
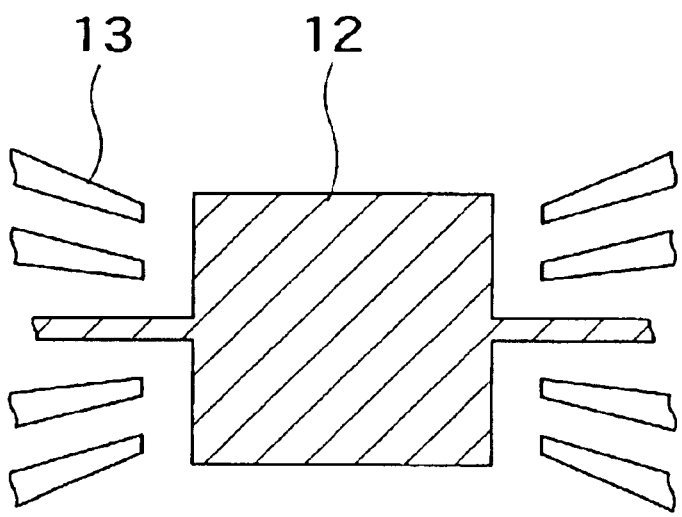

FIGS. 3A and 3B illustrate a comparison between a SAT image (FIG. 3A) in which the resin molding is effected by use of the lead frame of which the wire-bonded portions are silver-plated using the conventional BTA series rustproof agent, and a SAT image (FIG. 3B) in which the resin molding is effected by use of the lead frame of which the wire-bonded members are not silver-plated using the non-BTA series rustproof agent according to the embodiment of the present invention.

Referring to FIG. 3A, a detached area 20 is displayed in white, an areal size of which is, it proves, approximately 20% of an areal size of the tie pad. According to the tests by the present inventors, the detachment exhibiting a considerable rate was recognized from the initial state in the case of the resin molding using the conventional lead frame, whereas almost no detachment was seen in the case of performing the resin molding using the lead frame according to the embodiment of the present invention, and it proved that there is a remarkable difference therebetween.

Figure 4A:
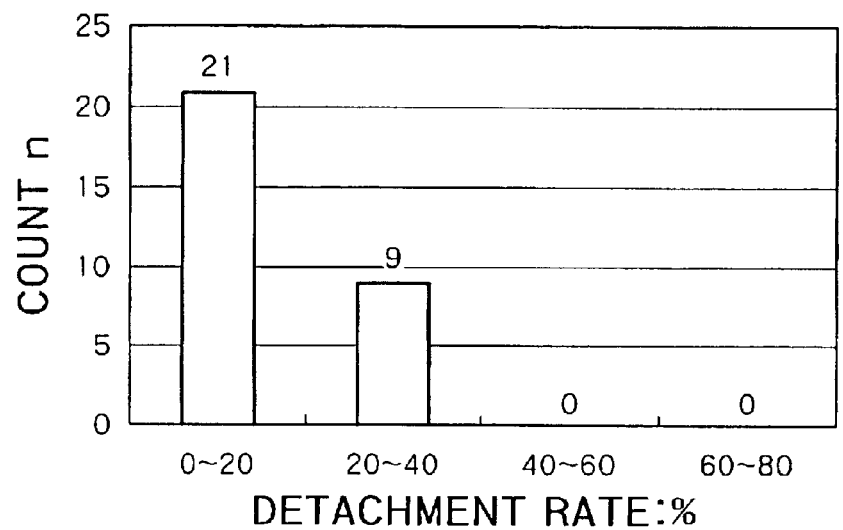
FIGS. 4A and 4B are graphs showing a difference between conditions under which the detachment occurs on the basis of a difference between rustproof agents.
Figure 4B:
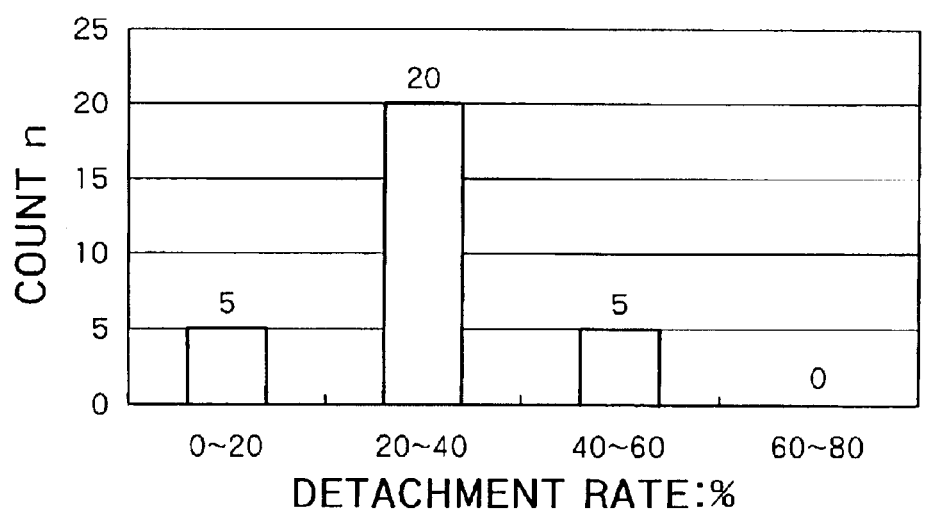

FIGS. 4A and 4B are graphs each showing a state of how much the detachment occurs in the semiconductor device in which the resin molding is performed by use of the lead frame with no silver-plating. FIG. 4A shows a case using the non-BTA series rustproof agent according to the present invention. FIG. 4B shows a case using the conventional BTA series rustproof agent. In FIGS. 4A and 4B, with respect to 30 pieces of samples, the sample counts at the detachment rates falling within ranges such as 00% to 20%, 20% to 40%, 40% to 60%, and 60% to 80%, are displayed in histograms.

It can be known from the graph that the embodiment of the present invention shows a less of the detached and shows, even though detached, a small area of the detachment.

Next, the dam bars are cut off, and the outer leads undergo such forming as to be bent, thereby obtaining the semiconductor device (step S6).

Figures 5, 6:
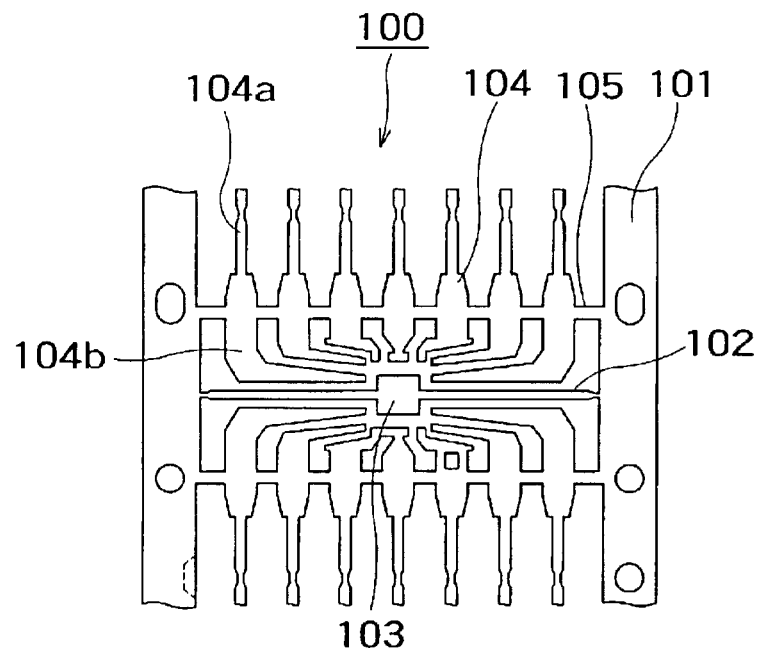
FIG. 5 is a table showing one example of an improvement of productivity by use of a non-BTA series rustproof agent.
FIG. 6 is a plan view showing a configuration a typical lead frame.

In order to prevent the outer leads from oxidation, lead free solder may be plated to the outer leads. An improvement of the productivity owing to adopting the non-BTA series rustproof agent could be seen also when performing the lead-free solder plating. FIG. 5 shows how this improvement is. In comparison between the lead frame in which the wire-bonded members are silver-plated by use of the conventional BTA rustproof agent and the lead frame not plated with silver by use of the non-BTA series rustproof agent according to the embodiment of the present invention, there could be attained a 10% reduction in each of an electrolyte field degreasing time for solder-plating the outer leads and a pre-processing time of a sulfuric acid series.

As discussed above, the semiconductor device using none of the noble metals can be obtained by reexamining the materials for the respective members.

The embodiment of the present invention adopts the lead frame containing no noble metal, the die bonding agent, the copper wires and the outer lead surface process, and is therefore capable of considerably decreasing the manufacturing costs without containing the expensive noble metals and removing a cause of the environmental pollution by using no lead harmful to the human body in any process.

Further, the semiconductor device manufacturing method in the embodiment of the present invention involves applying over the lead frame the non-BTA series rustproof agent that is decomposed away at a comparatively low temperature immediately after manufacturing the lead frame, and eventually schemes to thus prevent the outer leads from rusting. This therefore contributes to the reduction in costs in a way that avoids using the noble metals, and is capable of improving especially the reliability of the resin molding with no harmful residual substance left in the subsequent processes.

What is claimed is:

1. A semiconductor device comprising:
   a semiconductor chip;
   a base metal lead frame with no residual of a rustproof film, including a die pad mounted with said semiconductor chip, and a plurality of leads disposed so that inner ends of said leads are positioned along the periphery of said die pad;
   copper wires to directly connect electrodes on said semiconductor chip to the inner ends of said plurality of leads; and
   a resin molded member to hermetically seal said semiconductor chip, a large proportion of said lead frame and said copper wires;
   wherein an initial detachment area of said resin molded member at the bottom side of the die pad is 20% or less to the whole die pad area.

2. The semiconductor device according to claim 1, wherein said semiconductor chip is secured through a base metal series paste to said die pad.

3. The semiconductor device according to claim 2, wherein said base metal series paste is a conductive paste mainly composed of copper.

4. The semiconductor device according to claim 1, wherein said semiconductor chip is secured through a base metal series paste to said die pad.

5. The semiconductor device according to claim 4, wherein said base metal series paste is a conductive paste mainly composed of copper.

* * * * *